United States Patent [19]

Yasui et al.

[11] 3,966,499

[45] June 29, 1976

[54] SOLAR CELL GRID PATTERNS

[75] Inventors: Robert K. Yasui, Los Angeles; Paul A. Berman, La Crescenta, both of Calif.

[73] Assignee: The United States of America as represented by the Administrator, National Aeronautics and Space Administration, Washington, D.C.

[22] Filed: Apr. 19, 1974

[21] Appl. No.: 462,341

Related U.S. Application Data

[63] Continuation-in-part of Ser. No. 296,622, Oct. 11, 1972, abandoned.

[52] U.S. Cl. .................................. 136/206; 136/89
[51] Int. Cl.$^2$ ......................................... H01L 31/02
[58] Field of Search .............................. 136/89, 206

[56] References Cited
UNITED STATES PATENTS

| | | | |
|---|---|---|---|
| 2,310,365 | 2/1943 | Hansell ................................. | 136/89 |
| 2,320,185 | 5/1943 | Lamb ................................... | 136/89 |
| 2,668,184 | 2/1954 | Taylor et al. .......................... | 136/89 |
| 3,053,926 | 9/1962 | Ben-Sira et al. ...................... | 136/89 |
| 3,340,096 | 9/1967 | Mann et al. ........................... | 136/89 |
| 3,589,946 | 6/1971 | Tarneja et al. ........................ | 136/89 |

FOREIGN PATENTS OR APPLICATIONS 277,610    5/1928    United Kingdom.................. 136/89

*Primary Examiner*—Verlin R. Pendegrass
*Attorney, Agent, or Firm*—Monte F. Mott; Wilfred Grifka; John R. Manning

[57] ABSTRACT

A grid pattern for a solar cell of the type including a semiconductive layer doped to a first polarity and a top counter-doped layer. The grid pattern comprises a plurality of concentric conductive grids of selected geometric shapes which are centered about the center of the exposed active surface of the counter-doped layer. Connected to the grids is one or more conductors which extend to the cell's periphery. For the pattern area, the grids and conductors are arranged in the pattern to minimize the maximum distance which any injected majority carriers have to travel to reach any of the grids or conductors. The pattern has a multi-axes symmetry with respect to the cell center to minimize the maximum temperature differentials between points on the cell surface and to provide a more uniform temperature distribution across the cell face.

8 Claims, 10 Drawing Figures

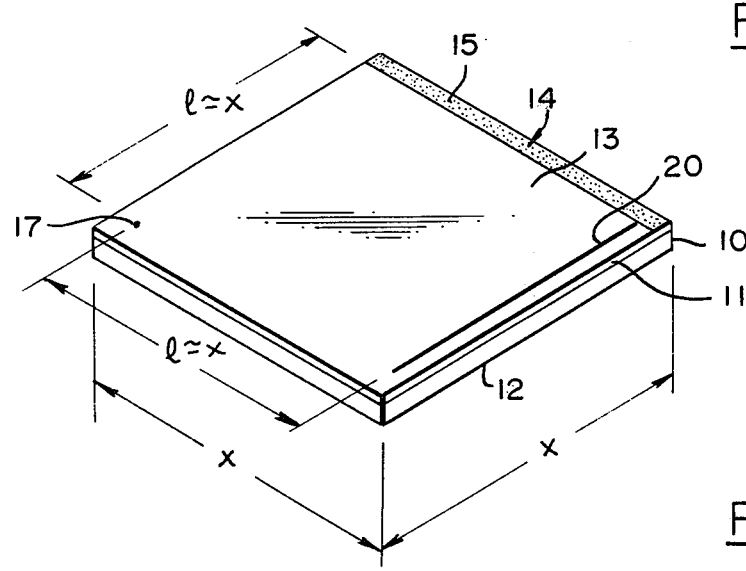
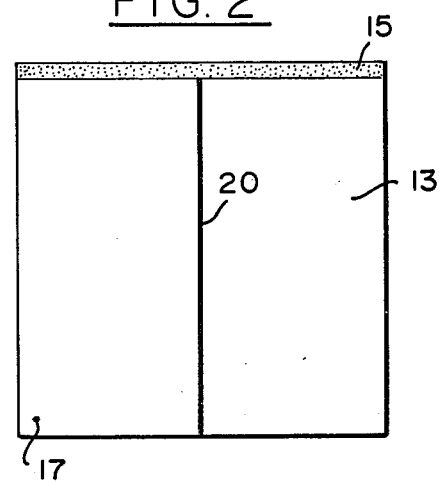
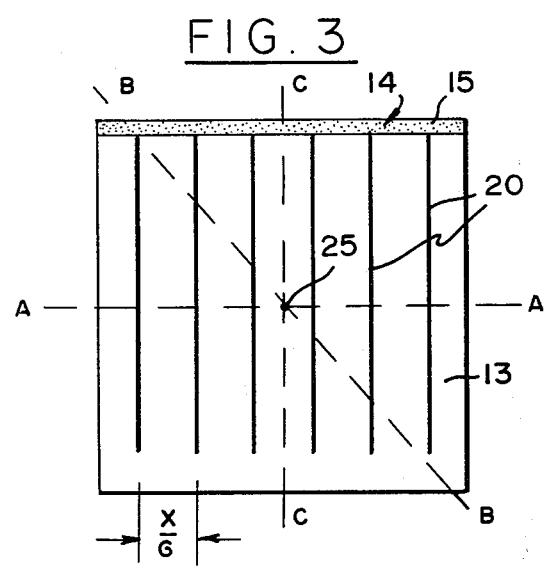
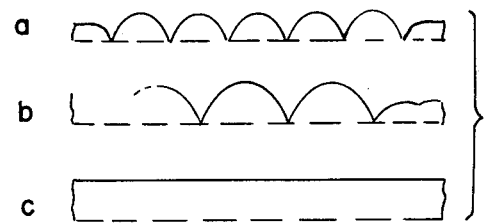
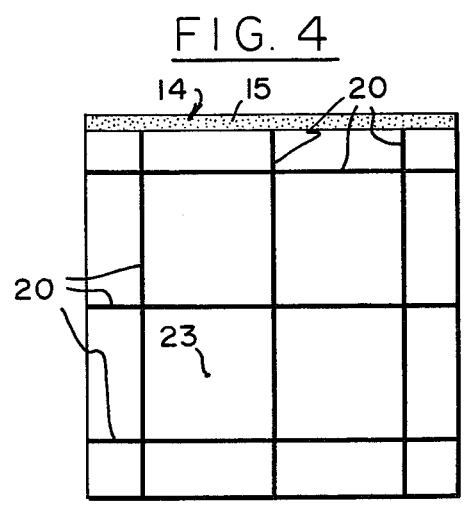

SOLAR CELL GRID PATTERNS

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 USC 2457).

CROSS REFERENCE TO RELATED APPLICATIONS

This application is a Continuation-In-Part Application of application Ser. No. 296,622 filed Oct. 11, 1972, and now abandoned.

BACKGROUND OF THE INVENTION

1. Field of the Invention:

The present invention is generally directed to solar cells and, more particularly, to improved metallized grid patterns for such cells.

2. Description of the Prior Art:

The use of solar cells to convert solar light into an electrical current is well known. The cell current is directly proportional to incoming solar light intensity, hereafter referred to as solar intensity and the area of the exposed cell surface. One type of a solar cell which has been used and to which the present invention is directed comprises a slab of semiconducting material which is doped to either the "N" or "P" polarity, so that the majority carriers are either electrons or "holes" respectively. The semiconducting material is generally referred to as the cell base.

On the cell base is a very shallow, e.g., 3,000A or less, counter-doped layer, whose outer surface, which is exposable to solar intensity represents the top cell face. The counter-doped layer is doped to a "P" polarity when the base is an "N" base and to an "N" polarity when the base is doped to a "P" polarity. The cell also includes a bottom electrode, generally in the form of an electrically conductive metallized layer deposited over the bottom side of the base, and a top electrode which is deposited on the top of the counter-doped layer, i.e., on the top cell face. Solar photons passing through the counter-doped layer into the cell base generate electron-hole pairs. The doped-counter doped regions result in creations of an internal electrical field so that with a "P" doped base and an "N" doped counter-doped layer photogenerated electrons are injected from the base into the counter doped layer where they become majority carriers travelling to the top electrode, while the photogenerator holes as majority carriers travel to the bottom electrode. Similarly, with an N base and a P counter-doped layer holes are injected into the counter-doped layer and electrons travel to the bottom electrode. The counter-doped layer presents a very small cross sectional area to the injected majority carriers which must eventually reach the top electrode, and additionally, the resistivity of the counter-doped layer is quite high in comparison with the resistivity of metals such as silver or aluminum. Consequently, in order to reduce this considerable electrical resistance, presented to the majority carriers flowing through the counter-doped layer to the top electrode, an electrically conductive metallized grid pattern is deposited on the active cell surface, i.e., on the top cell face, which is exposed to the solar intensity. The grid pattern is in electrical contact with the top electrode so that once majority carriers reach any part of the grid pattern, the resistance presented to them is that of the metallized pattern.

As used herein, the term solar cell intends to refer to a cell with a cell base doped to one polarity and a counter doped layer doped to another polarity. The invention is directed to the grid pattern so as to reduce the series resistance presented to the majority carriers in the counter-doped layer.

In many known prior art solar cells, grid patterns are employed in which the path length which majority carriers have to travel to a conductive grid of the pattern increases dramatically with distance from the cell's geometric center. Also, in others, some of the path lengths are unnecessarily long thereby producing high cell series resistance. These characteristics are most disadvantageous, particularly at high solar intensities, which are present near the sun or when solar concentrators are employed. In the prior art cell series resistance is high and therefore power dissipation in the cell in the form of heat is high, thereby decreasing the cell's efficiency. Furthermore, in the prior art due to the grid patterns employed therein, large temperature differentials across the cell's face are experienced, which is particularly undesirable at high solar intensities. Large temperature differentials lower the point at which cell power begins to decrease with increasing solar intensity.

OBJECTS AND SUMMARY OF THE INVENTION

It is a primary object of the present invention to provide improved metallized solar cell grid patterns.

Another object of the invention is to provide a solar cell exhibiting a more uniform temperature distribution across the cell face than prior art cells.

A further object of the invention is to provide a solar cell which is more efficient at high solar intensities than prior art cells.

These and other objects of the invention are achieved by providing a solar cell with a metallized grid pattern consisting of concentric geometric figures about the cell's geometric center. The concentric figures are preferably equally spaced from one another where the distance between any adjacent pair of figures is definable as L. The grid pattern is deposited on the cell so that the path length of any injected majority carrier, at any point on the cell face, is never greater than L/2, and is independent of the distance from the geometric center. The concentric figures are interconnected by one or more intersecting metallized main current-carrying connections or conductors. A cell with such a grid pattern exhibits relatively low cell series resistance thereby exhibiting less power loss which is dissipated in the form of heat. Furthermore, the pattern is chosen to produce relatively low temperature differentials and thereby a more uniform temperature distribution across its face. Consequently, the decrease of cell power with increasing solar intensity occurs at a higher point of solar intensity than is experienced with solar cells employing conventional grid patterns.

BRIEF DESCRIPTION OF THE DRAWINGS

FIGS. 1–5 are diagrams useful in explaining the state of the art and its disadvantages;

DESCRIPTION OF THE PREFERRED EMBODIMENTS

Figure 6:
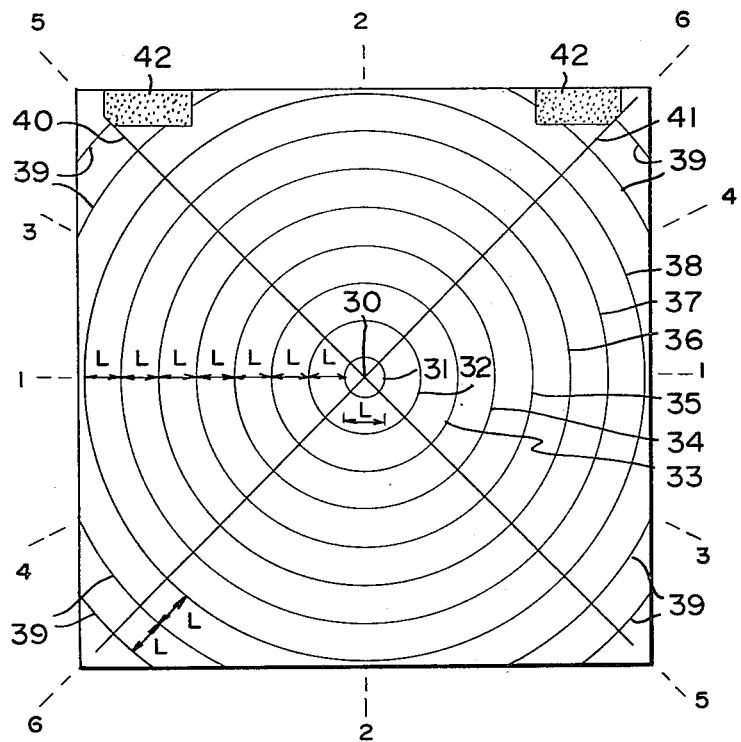
FIG. 6 is a top view of one embodiment of the novel grid structure of the present invention.

Attention is directed to FIG. 1 wherein a general solar cell of the type to which the invention is directed is shown. It consists of a chip or layer of photosensitive doped semiconductive cell material, 10, e.g., silicon on which a counter-doped layer 11 is present. A bottom metallized electrode 12 is deposited on the bottom side of layer 10 while the top surface 13 of layer 11 is the one, which is exposable to solar light. It is often referred to as the cell surface or simply the cell face. Deposited on part of the surface 13 is a highly electrically conductive metallized grid structure 14. The portion of face 13 which is not covered by the grid structure represents the active cell face. As is known, the electrical current is produced due to the solar light impinging on the active cell face 13 which penetrated to layer 11 and which produces majority carriers which travel through the counter-doped layer 11 to the grid structure. The series resistance presented to an individual majority carrier in layer 11 is given by the familiar relationship $$R_L = pl/A,$$

where $p$ is the resistivity of the layer 11, $l$ is the distance of the individual majority carrier from the grid structure 14 and $A$ is the cross sectional area of the layer 11 (typically 3,000A or less) in a plane perpendicular to face 13. Assuming that the cell is square shaped, the length of each side being $x$, and of a layer 11 of a thickness $t$, $$R_L = pl/xt,$$

where $R_L$ is the electrical resistance of the counter doped layer 11.

In order to increase the cell's efficiency it is important to reduce the cell's series resistance and hence the electrical resistance of the counter doped layer 11. This is achieved by designing the grid structure 14 to include several current conducting grids spaced on the cell face 13 so as to minimize the maximum path length, designated $l_m$, of any majority carrier to the grid structure and thereby reduce its series resistance. Assuming that the grid structure 14 only includes a conductive strip 15 at the cell upper end, which serves as the cell's electrode and assuming that a majority carrier is injected at point 17, (near the lower left-hand corner) it is seen that $l_m \simeq x$. By including a grid 20 which is at or near the right end of the cell in a direction perpendicular to electrode 15, the distance $l_m$ is not decreased, since the distance from point 17 to either electrode 15 or grid 20 is still nearly equal to $x$. If, however, grid 20 is located so as to bisect the surface 13 as shown in FIG. 2, the maximum distance $l_m$ is cut in two, i.e., $l_m = x/2$.

It is obvious that $l_m$ can be reduced by increasing the total area of the grid structure 14, defined as $A_p$, with respect to the total area of surface 13, defined as $A_c$. However, by increasing the structure area $A_p$ the net exposed area of the cell, i.e., the active cell area, defined as $A_a$, where $A_a = A_c - A_p$, is reduced, thereby reducing the cell efficiency.

Thus, in designing a cell every effort is made to minimize $A_p$, i.e., maximize $A_a$ taking into consideration the total current which may be produced. From the foregoing however, it should be appreciated that even for the same grid area $A_p$, R can be reduced by the particular design and layout of the grid structure. In FIGS. 1 and 2, the area $A_p$ is the same. Yet by placing grid 20 in the middle of the cell, as shown in FIG. 2, rather than at the cell edge, as shown in FIG. 1, $l_{max}$ is reduced from $x$ to $\frac{1}{2}x$.

In the prior art, the most widely used pattern for the grid structure is one consisting of a plurality of essentially parallel grids, all perpendicular to the electrode 15, as shown in various U.S. patents including U.S. Pat. No. 3,340,096. FIG. 3 shows six such parallel grids 20. They are generally equally spaced from one another and from the cell's edges to which they are parallel. With six such grids on a 1 × 1 inch cell, they are spaced $x/12$ inch from the outer cell edges. Thus, $l_m = x/12$ or $l_{average} = x/24$. Such an arrangement is preferable to one in which the six grids are oriented so as to produce a mesh, such as shown in FIG. 4. In such an arrangement, the vertical or horizontal grids are spaced $x/3$ inch apart and $x/6$ inch from the edges. Thus, $l_m$ for a carrier at the center of a square opening of the mesh, such as at point 23, is only $x/6$ and $l_{average} = x/12$ which is twice as great as $l \simeq x/24$.

From the foregoing, it is seen that even though the grid structure area $A_p$ of the structures, shown in FIGS. 3 and 4, is the same, the grid pattern in FIG. 3 is much more desirable since it produces a lower series resistance by a factor of 2, and therefore results in a more efficient cell. Generally, it can be seen that with fewer grid intersections in the grid structure pattern, the series resistance is higher for the same grid structure area $A_p$.

One of the major disadvantages of the cell as shown in FIG. 3 is that its temperature differentials vary along different lines on its surface. As is appreciated the grids 20 in addition to acting as current conductors also serve as heat sinks. They reflect the solar light which impinges thereon and are therefore cooler than the neighboring cell surfaces, exposed to the solar light. Thus, some heat flows from the hot exposed cell areas to the adjacent grids. However, since the grid pattern is not symmetrical, the temperature differentials differ along different lines. For example, the temperature differentials or variations along lines A—A, B—B and C—C, all of which are assumed to pass through the center 25 of surface 13 are diagrammed in FIG. 5, lines a-c respectively. These different temperature differentials cause higher than desirable cell equilibrium temperatures which is most undesirable since higher cell equilibrium temperatures lower the point at which cell power begins to decrease with increasing solar intensity.

These disadvantages are eliminated by the present invention. In accordance with the present invention a cell is provided with a grid structure, patterned to minimize the maximum path length $l_m$. In addition, however, the grid structure is one which is characterized by a multi-axes symmetry, in that the temperature differential along practically any line passing through the cell center is the same. Thus, the cell's temperature equilibrium is lower than in the absence of such multi-axes symmetry.

One embodiment of the invention is shown in FIG. 6. Therein the grid structure is shown to include a plurality of concentric circular or ring-shaped grids, all centered about the cell's center 30. For explanatory purposes, only eight full circular grids are shown and they are designated 31–38. These circular grids are equally spaced from one another a distance L. The radius of the smallest circular grid 31, which is closest to center 30 is assumed to be ½L. The radius of each succeeding circular grid is 1L greater than the radius of the adjacent smaller circular grid. It should thus be apparent that $l_m$ of any majority carrier injected between any two grids or up to ½L from grid 38 is only ½L. In order to minimize the maximum path length for majority carriers injected near the corners of the square-shaped cell, the grid structure may include several arc-shaped grids 39 of increased radii, spaced apart a distance L from one another and from the longest complete circular grid 38.

In the embodiment shown in FIG. 6, two main current-carrying conductors 40 and 41 are shown, terminating in electrodes 42, which together serve the function of the electrode 15 previously described. The function of the conductors 40 and 41 is to collect the current on the various grids and carry it to the electrodes 40. As shown, the conductors 40 and 41, which extend radially across the circular grids 31–38 through center 30 are perpendicular to one another and are in essence the diagonals of the square-shaped cell.

It should thus be apparent that in this cell due to the particular pattern of the grid structure $l_m = $ ½L. The pattern, unlike that of prior art grid structures has a multi-axes symmetry about the center 30. Ignoring the electrodes 42, except along lines coinciding with the conductors 40 and 41, the temperature differentials along any line passing through the center 30 is the same. It is clearly the same along any two orthogonal imaginary lines. For example, it is the same along lines 1—1 and 2—2, 3—3 and 4—4. It is also the same along lines 5—5 and 6—6 which coincide with the conductors 40 and 41. Due to the multi-axes symmetry of the pattern, resulting in nearly identical temperature differentials along nearly every line (except along the conductors) passing through center 30, the attainable cell temperature equilibrium is lower than that for a cell with an unsymmetrical pattern. As a result, the point at which cell efficiency starts to fall with increasing solar intensity is increased. Thus, the cell of the present invention exhibits improved efficiency over prior art cells.

Tests were conducted on two cells of the same size and cell materials under identical conditions. One cell was the conventional parallel grid structure and the other with the novel grid structure of the present invention. The tests revealed at a 5% increase in efficiency with the grid structure of the present invention. Each of the two cells consisted of a chip of silicon 10 ohm-cm, 2 × 2cm, of a thickness of about 0.03 cm with a pattern of 12 concentric circular rings with L ≈ 0.043 inch. Nine of the circular grids were complete circles or rings while the outer three were only arc shaped.

Figure 7:
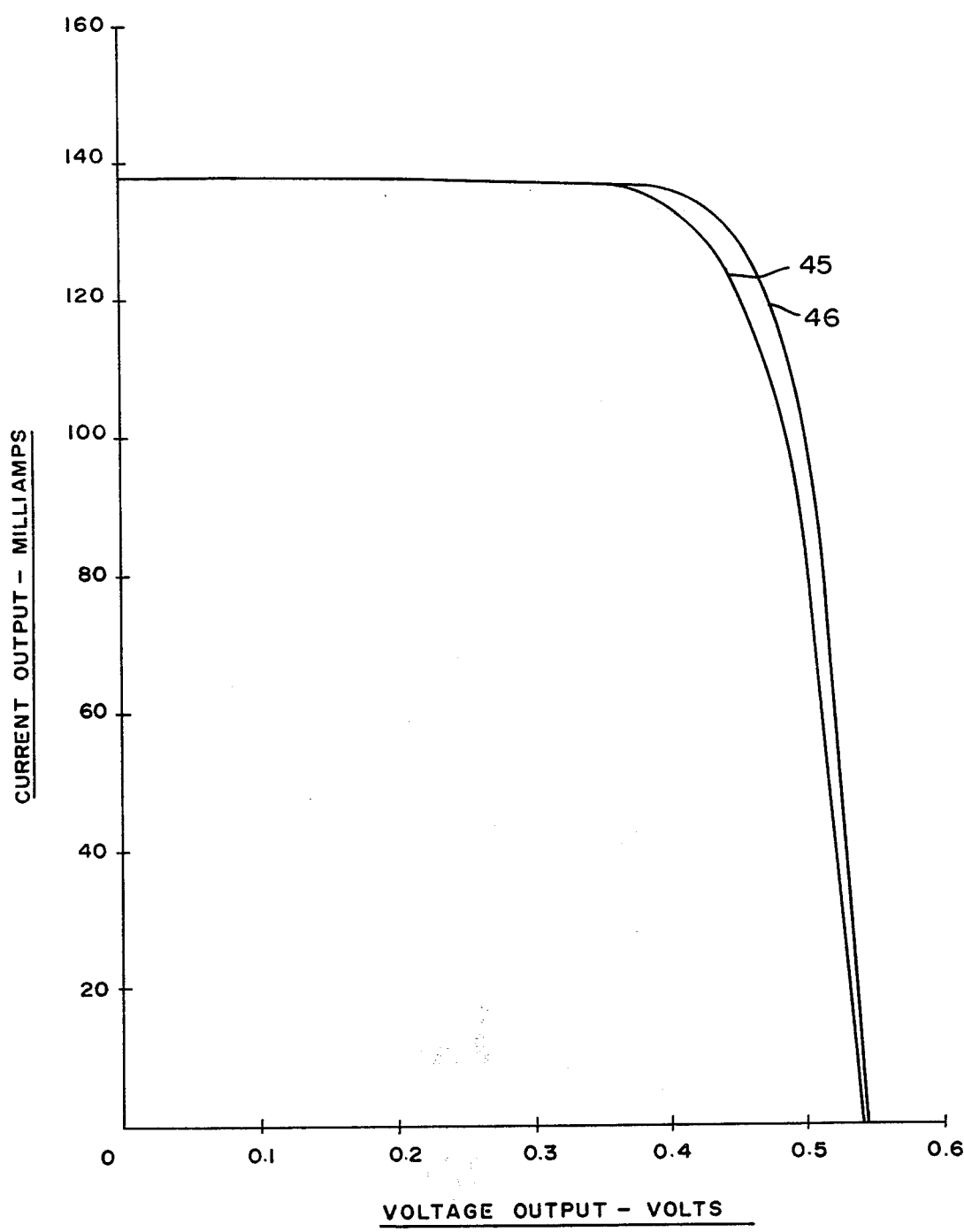
FIG. 7 is a diagram of current-voltage curves of a prior art cell and one in accordance with the present invention.

FIG. 7 is a current voltage diagram of the two cells. Therein, line 45 designates the conventional cell performance and line 46 the cell with the novel grid structure. As seen, the short circuit current is the same thereby indicating that $A_p$, i.e., the area covered by the grid structure of each cell is the same. As clearly seen, the novel cell is more efficient with one solar intensity of about 140mw/cm². The novel cell exhibited a power output of 59.1mw while the cell with the conventional grid structure exhibited a power output of only 56.2 mw.

In FIG. 6, the widths of all the circular and arc shaped grids, as well as the conductors 40 and 41 are represented as being of equal widths by the equal width lines. In practice, the conductors may be tapered with increasing width toward the electrodes 42 to accommodate the increasing current carried by these conductors along portions closer to the electrodes.

Figure 8:
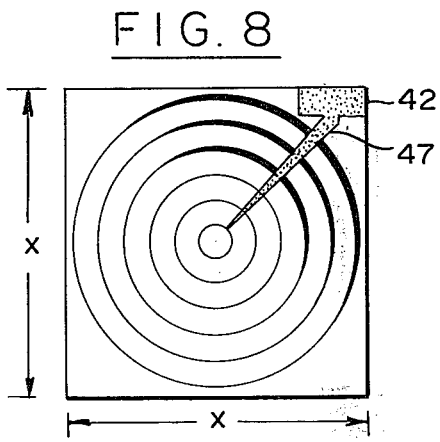
FIGS. 8–10 are top views of other embodiments of the novel grid structure of the present invention.

The difference between the area of a square with sides $x$ and a circle centered in the square with diameter $x$ as shown in FIG. 8 is $x^2 - \pi x^2/4$ or less than 20% of the total area. Thus, if desired the pattern may include only full circular grids without the arc-shaped grids 39. In such an embodiment a single conductor 47 may be used as shown in FIG. 8. The single conductor 47 extends from the innermost circular grid to the outermost grid. This would reduce the grid structure area $A_p$ at the price of increased maximum path length for majority carriers injected near the corners of the square cell. In FIG. 8, the conductor 47 is shown of increased width toward electrode 42 to accommodate the larger currents flowing therein. It should be stressed that in the embodiment shown in FIG. 8, the multi-axes symmetry is also present since the pattern is symmetrical along nearly every line through center 30 except along the line coinciding with the conductor 47. Since in each grid current flows which is due to the injected majority carriers travelling through the grid, the grid may be designed with increased width toward the point at which the grid intersects conductor 47.

Figure 9:
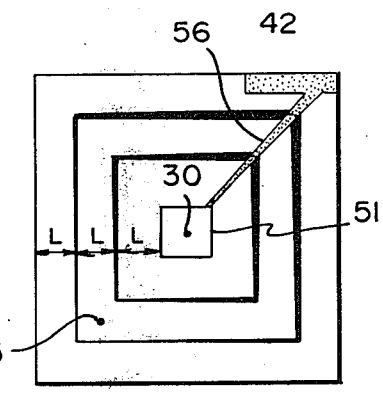

Although the invention has been described in connection with a grid structure which includes concentric circular grids, the invention is not intended to be limited thereto. FIg. 9 is a top view of a cell with a grid structure in which the circular grids are replaced by square-shaped grids designated 51–53. They are positioned so that the center 30 is common to all of them. Thus, even though they are square-shaped rather than circular they can be thought of as being concentric about center 30.

Assuming that the smallest square grid 51 is of side length L, the square grids are spaced apart a distance L, and the outer square grid 53 is spaced a distance L from the cell edges. It should be apparent that the largest distance $l_m$ is for a majority carrier injected at a point between two grid corners such as point 55. In this case $$l_{max} = \sqrt{\left(\frac{L}{2}\right)^2 + \left(\frac{L}{2}\right)^2} = \frac{L}{\sqrt{2}}.$$

However, for most carriers the maximum distance $l_m$ is L/2, which is the distance between any pair of adjacent grids. In FIg. 9, a single conductor 56 is shown extending from the innermost square grid 51 to the electrode 42 at the cell periphery. The widths of the grids are shown increasing toward conductor 56, which is also of variable width.

In general, the grid structure of the present invention can be thought of as one including a plurality of electrically conductive metallized spaced apart grids of a preselected geometric shape, e.g., circularly shaped or square shaped. Each grid defines the boundaries of a plane figure (circle or square) of a different fixed area, such as the different areas defined by circles 31–38 or squares 51–53. The grids, whether circular or square shaped, are concentric about the cell's center 30. That is, they are organized about the center with equal distances between them, such as L. The structure further includes at least one radial conductor such as 47 or 56 in FIGS. 8 and 9, respectively, which is in contact with each grid and extends to the cell periphery. The pattern is symmetrical in that it is substantially identical along any line passing through the center except along a line along the conductor. Also, the structure is patterned so that some of the cell active face is exposed on either side of each grid or conductor. This enables each grid or conductor to gather the current induced by majority carriers injected on either side thereof.

Figure 10:
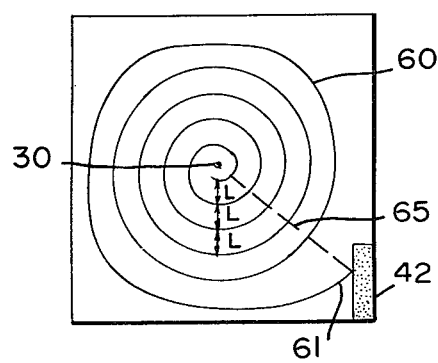

It should be apparent that the invention is not limited to circular or square shaped grids. Indeed any polygon-shaped grids can be employed. In addition, all the grids may be replaced by a single spiral shaped grid 60, as shown in FIg. 10, with the outer end 61 of the spiral connected to the electrode 42. The spiral grid 50 circles around the center 30 in curves that constantly increase in size toward the cell periphery. The distance between curves is substantially L. Thus, the maximum distance $l_m$ is substantially L2. The outer curves of the spiral 60 may be modified to become square shaped so as to cover the areas close the cell's corners. If desired, one or more conductors such as conductors 47 and 56, as shown in FIGS. 8 and 9, respectively, may be included to contact all the spiral curves and carry the current therefrom to the electrode at the cell periphery, as represented by dashed line 65.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A solar cell exposable to solar radiation comprising:
   a first layer of semiconductive material doped to a first polarity, having a top surface and a bottom surface;
   a second layer of material doped to a second polarity opposite said first polarity, having a bottom surface in contact with the top surface of said first layer and a top surface exposable to solar radiation, a point on said top surface defining a center; and
   a metallized grid pattern on said second layer top surface and in contact therewith, the pattern including a plurality of electrically conductive metallized spaced apart grids of a preselected geometric shape, each grid being formed of a separate continuous metallic strip defining the boundaries of a plane figures of a different fixed area, and the grids being organized about said center and with equal distances between them, the distance between any pair of adjacent grids being definable as L and a plurality of electrical conductors, each conductor being radially disposed on said surface and in electrical contact with each of said grids and extending from the grid closest to said center to the periphery of said surface whereby the maximum distance of any majority carrier, injected in said semiconductor material in response to the exposure of said semiconductor material to solar radiation, to any of said grids, is not greater than ½L with said metallized grid pattern being substantially identical along an imaginary straight line passing through said center, except for lines along said conductors, with said pattern being located on said second layer top surface so that portions of the surface not covered by said pattern are exposed on either side of each grid and each conductor.

2. A solar cell as described in claim 1 wherein all of said strips are of uniform width on said surface.

3. A solar cell as described in claim 1 wherein the width of at least one conductor increases from a first end at which the conductor is in contact with the grid closest to said center to the conductor's second end at the periphery of said second layer top surface.

4. A solar cell as described in claim 1 wherein the width of at least one conductor at said second layer top surface periphery is greater than its width at the point at which it is in contact with said grid closest to said center.

5. A solar cell as described in claim 1 wherein the average width of each strip increases with increased distance of the strip from said center.

6. A solar cell as described in claim 3 wherein each of said grids is circularly shaped.

7. A solar cell as described in claim 3 wherein each grid is square shaped.

8. A solar cell exposable to solar radiation comprising:
   a first layer of semiconductive material doped to a first polarity having a top surface and a bottom surface;
   a second layer of material doped to a second polarity opposite said first polarity, having a bottom surface in contact with the top surface of said first layer and a top surface exposable to solar radiation, a point on said top surface defining a center; and
   a metallized grid pattern in contact with and covering a portion of said surface, said pattern including a spirally shaped electrically conductive grid member which circles around a selected point on said surface in curves that constantly increase in size toward the periphery of said surface, with the distance between curves being substantially constant, whereby the maximum distance of any point on said surface not covered by said grid pattern is substantially equal to substantially half the distance between adjacent curves, and at least one electrically-conductive radial conductor extending from one end at the inner most curve of said grid member to a second end at the periphery of said surface, said radial conductor being in electrical contact with all the curves on said surface between the ends thereof, with portions of said surface being exposed on either side of each curve and said at least one conductor, the pattern being substantially identical along any imaginary straight line passing through said selected point except for a line aligned with said at least one conductor.

* * * * *